United States Patent

[11] 3,602,839

[72] Inventors Wallace D. Williams
Somerville;
Douglas A. Moe, Plainfield; Carl R. Turner,
Hopatcong, all of, N.J.
[21] Appl. No. 22,112
[22] Filed Mar. 30, 1970
[23] Continuation of Ser. No. 718,156, April 2, 1968, abandoned
[45] Patented Aug. 31, 1971
[73] Assignee RCA Corporation

[54] INVERTER INCLUDING COMPLEMENTARY TRANSISTORS
4 Claims, 8 Drawing Figs.

[52] U.S. Cl. ........................................ 331/113 A, 321/2, 331/110

[51] Int. Cl. ........................................ H02m 7/24

[50] Field of Search ........................................ 331/113.1, 113, 110, 114, 108.3

[56] References Cited

UNITED STATES PATENTS

| | | | |
|---|---|---|---|
| 3,030,590 | 4/1962 | Fougere et al. | 331/113 |
| 3,080,534 | 3/1963 | Paynter | 331/113 |
| 3,299,370 | 1/1967 | Massey | 331/110 |

OTHER REFERENCES

D. D. Baumann, IBM Tech. Disc. Bul., " Free-Running Bridge Inverter," Vol. 9, No. 10, Mar. 1967, 331-110.

*Primary Examiner*—John Kominski

ABSTRACT: Inverters including complementary transistors and single ended or center tapped sources of current supply.

INVENTORS:
WALLACE D. WILLIAMS
DOUGLAS A. MOE AND
CARL R. TURNER

BY Simon Yaffee
ATTORNEY

INVERTER INCLUDING COMPLEMENTARY TRANSISTORS

This is a continuation of my copending application Ser. No. 718,156, filed Apr. 2, 1968 and now abandoned.

BACKGROUND

Inverter circuits including saturable transformers and using transistors of the same type, in which the transistors are rendered alternately conductive are known. Since the energy stored in a portion of the leakage inductance of the saturable transformer may be dissipated in each transistor when it becomes nonconductive, such inverters sometimes suffer reversed biased second breakdown of the transistors. Therefore in such known inverters using transistors of the same type, expensive second breakdown free transistors or especially designed low leakage inductance saturable transformer, or both, must be provided to produce a reliable inverter.

It is an object of this invention to provide an improved inverter.

It is another object of this invention to provide an inverter including transistors in which the transformer leakage inductance does not injure the transistors.

SUMMARY

In accordance with this invention, an inverter is provided including a saturable feedback transformer and at least two transistors of complementary type which are rendered alternately conductive. The transistors and the saturating transformer are so connected that the energy stored in the transformer leakage inductance is directed through the transistor which is becoming conductive, whereby the energy stored in the leakage inductance is not applied to either transistor in a manner to cause reversed biased second breakdown thereof. Therefore inverters are provided which do not require expensive low leakage inductance transformers or second breakdown free transistors. The load may be coupled to a third winding on the saturable feedback transformer or if desired a separate output transformer may be provided.

The invention may be better understood upon reading the following description in connection with the accompanying drawing in which FIGS. 1 to 8 illustrate various embodiments of this invention.

Figure 1:
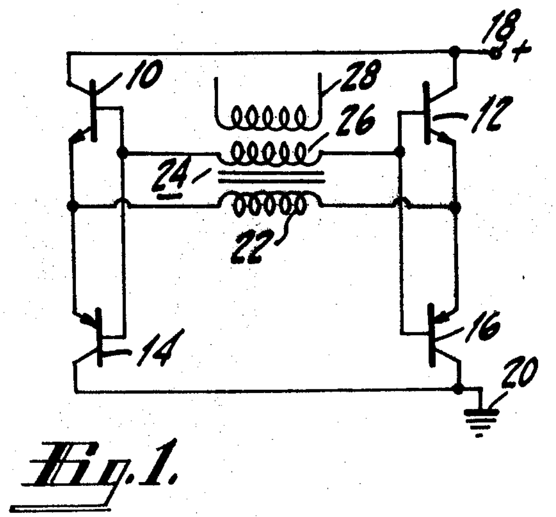
Figure 2:
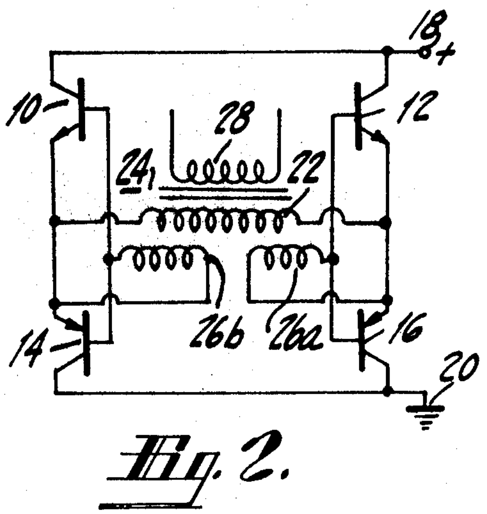

Bridge type inverters are illustrated in FIGS. 1 and 2. As shown in FIG. 1, a pair of NPN transistors 10 and 12 and a pair of PNP transistors 14 and 16 are provided. The positive terminal 18 of a supply source (not shown) is connected to the collectors of the transistors 10 and 12. The emitters of the transistors 10 and 12 are connected respectively to the emitters of the transistors 14 and 16. The collectors of the transistors 14 and 16 are connected to the other terminal 20 of the supply source, which may be system ground. The bases of the transistors 10 and 14 are connected to each other, and the bases of the transistors 12 and 16 are connected to each other. The primary winding 22 of a three winding saturable core transformer 24 is connected between the junction of the emitters of the transistors 10 and 14 and the junction of the emitters of the transistors 12 and 16. The secondary winding 26 of the transistor 24 is connected between the junction of the bases of the transistors 10 and 14 and the junction of the bases of the transistors 12 and 16. The third or output winding 28 of the transformer 24 provides an alternating current supply for a load (not shown) which may be connected across the terminals of the winding 28.

When positive voltage is applied on the terminal 18 with respect to ground terminal 20, current may flow into the collector of either of the transistors 10 or 12 and out the emitter thereof. Let it be assumed that current flows through the transistor 12. Then current flows through the primary winding 22, into the emitter of the transistor 14 and out the collector thereof and into the ground terminal 20. As the current flowing through the primary winding 22 increases, a voltage will be induced in the secondary winding 26 that will be of a polarity to render the transistors 10 and 16 nonconductive and to render the transistors 12 and 14 conductive. When saturation of the transformer 24 is reached, the impedance of the transformer 24 suddenly decreases and the current passing therethrough suddenly increases to the point of pulling out of saturation of the transistors 12 and 14, that is, to the point when the voltage between the collector and emitter increases. When the current through the transistors 12 and 14 stops increasing and begins to decrease, voltage is induced in the secondary winding 26 that renders the transistors 12 and 14 nonconductive and renders the transistors 10 and 16 conductive, whereby current flows through the primary winding 22 in the opposite direction. Therefore, an alternating voltage is induced in the load winding 28 that may be applied to a load connected thereacross. It will be noted that when the transistors 12 and 14 become nonconductive, the transistors 10 and 16 become nonconductive, the transistors 12 and 14 provide a path for the energy stored in the leakage inductance. Therefore, no low leakage transformer or second breakdown free transistors need be provided. It is also noted that a center tap transformer is not required in the described inverter.

Like elements in FIGS. 1 and 2 are given identical reference numerals. FIG. 2 differs from FIG. 1 only in that the secondary winding 26 of FIG. 1 appears as two secondary windings 26*a* and 26*b* in FIG. 2, and in that the winding 26*a* is connected between the bases and emitters of the transistors 12 and 16, and in that the winding 26*b* is connected between the bases and emitters of the transistors 10 and 14. The circuits of FIGS. 1 and 2 operate in a similar manner.

Figure 3:
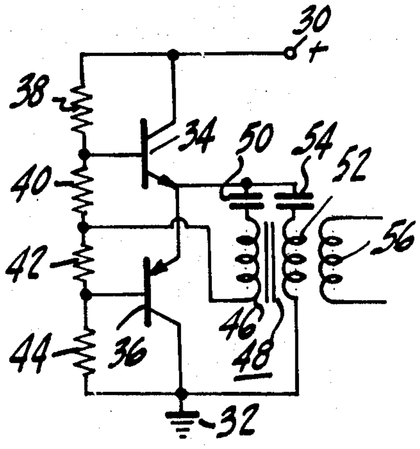
Figure 4:
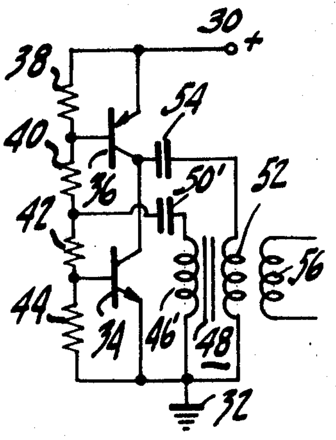

Single ended inverters including two complementary transistors and requiring only one polarity of voltage supply with respect to ground are shown in FIGS. 3 and 4. A terminal 30 of a supply source (not shown) of voltage that is positive with respect to the other terminal of the supply source or ground 32 is connected to the collector of an NPN transistor 34 whose emitter is connected to the emitter of an PNP transistor 36. The collector of the transistor 36 is connected to the ground terminal 32. A plurality of resistors 38, 40, 42 and 44, which together comprise a potentiometer, are connected in the order named from the terminal 30 to ground terminal 32. The junction of the resistors 38 and 40 is connected to the base of transistor 34 and the junction of the resistors 42 and 44 is connected to the base of a transistor 36. The junction of the resistors 40 and 42 is connected through the secondary winding 46 of a saturable core transformer 48 and a large blocking capacitor 50 in series to the junction of the emitters of the transistors 34 and 36. The potentiometer resistors 38, 40, 42 and 44 are useful to properly proportion the voltages applied to the transistors 34 and 36 and also to insure starting of the inverters in which they are included. The primary winding 52 of the transformer 48 is connected between ground 32 and a second large blocking capacitor 54 to the emitters of the transistors 34 and 36. A load winding 56 of the transformer 48 is provided to supply a load (not shown) that may be connected across the winding 56.

Since positive potential is applied to the collector of the transistor 34 and a lesser positive potential is applied to the base of the transistor 34, current will flow through the transistor 34 and in the primary winding 52, inducing a voltage in the transformer secondary winding 46, due to its coupling with the transformer primary winding 52, that is of a polarity to render the transistor 34 conductive and to render the transistor 36 nonconductive while current flow in the winding 52 is increasing. When the transformer 48 is saturated, the current flow in the transistor 34 suddenly increases whereby the transistor 34 pulls out of saturation. When the current in the primary winding 52 starts to decrease, the voltage induced in the secondary winding 46 is such as to block the transistor 34 and to make conductive the transistor 36, whereby the capacitor 54 discharges through the transistor 36. When current flow in the winding 52 is substantially zero, current flows through the transistor 34, into the capacitor 54 and through the primary winding 52 to start another cycle of operation of the inverter of FIG. 3. Since current flows through the winding 52 in opposite directions, an AC voltage is induced in the load coil 56. As in FIGS. 1 and 2, the energy stored in the leakage inductance of the transformer 52 finds a path through the one of two transistors 34 and 36 that is conductive.

In FIGS. 3 and 4, similar elements bear identical reference numbers. FIG. 4 differs from FIG. 3 only in that the secondary winding 46' and the capacitor 50' in FIG. 4 are connected between ground 32 and the junction of the resistors 40 and 42, while in FIG. 3 the secondary winding 46 and the capacitor 50 are connected between the junction of the resistors 40 and 42 and the emitters of the transistors 34 and 36 and in that the positions of the transistors 34 and 36 are interchanged. The circuits of FIGS. 3 and 4 operate in a similar manner.

Figure 5:
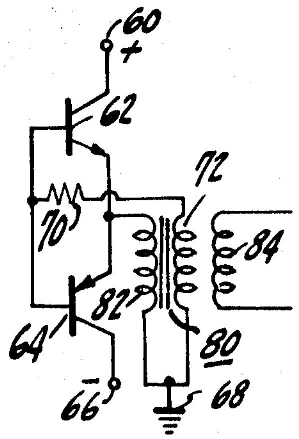

FIGS. 5, 6, 7 and 8 disclose single ended inverters including two complementary transistors and including a supply source having three terminals, two of which are respectively positive and negative with respect to the third or grounded terminal. As illustrated in FIG. 5, the positive terminal 60 of a voltage source (not shown) is connected to the collector of an NPN transistor 62, whose emitter is connected to the emitter of a PNP transistor 64. The collector of the transistor 60 is connected to the negative terminal 66 of a source (not shown). The bases of the transistors 62 and 64 are connected together and the bases of the transistors 62 and 64 are connected to ground 68 by way of a resistor 70 and the secondary winding 72 of a saturable core transformer 80 in series. The emitters of the transistors 62 and 64 are connected to the grounded terminal 68 by way of the primary winding 82 of the transformer 80. A load (not shown) may be connected across the terminals of a load winding 84 of the transformer 80.

When the circuit of FIG. 5 is energized, current will flow from the terminal 60 through the collector to emitter path of the transistor 62 and through the primary winding 82 of the saturable core transformer 80, or, from ground 68, through the primary winding 82 and through the emitter to collector path of the transistor 64 and to the terminal 66. While this current is increasing, a voltage will be induced in the secondary coil 72 that will render the conductive transistors more conductive and will render the other transistor less conductive. When saturation of the transformer 80 is reached, the current flowing in the conductive transistor will suddenly increase to the point of pulling out of saturation of the conductive transistor, and the current flowing in the conductive transistor will then cease to increase and then begin to decrease. A voltage will then be induced in the secondary winding 72 that will be of a polarity to block the previously conductive transistor and to render the previously blocked transistor conductive. Therefore, current flows in the primary winding 82 in one direction when the transistor 62 is conductive and in the opposite direction when the transistor 64 is conductive. Therefore, an alternating current is induced in the load winding 84. The resistor 70 acts as an equalizing resistor, whereby the need to match the transistors 62 and 64 is avoided.

Figure 6:
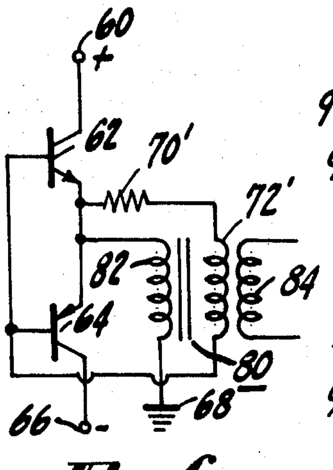

Identical elements similarly connected in FIGS. 5 and 6 are given identical reference characters. FIG. 6 differs from FIG. 5 in that in FIG. 5, the resistor 70 and the secondary winding 72 are connected between the bases of the transistors 62 and 64 and ground, while in FIG. 6, corresponding resistors 70' and secondary winding 72' are connected between the emitters of the transistors 62 and 64 and the bases of the transistors. However, the operation of the circuits of FIGS. 5 and 6 is similar. It is noted that in FIGS. 5 and 6, the energy stored in the transformer 80 leakage inductance is commutated from one transistor to the other, whereby low leakage transformers or second breakdown fee transistors need not be provided.

Figure 7:
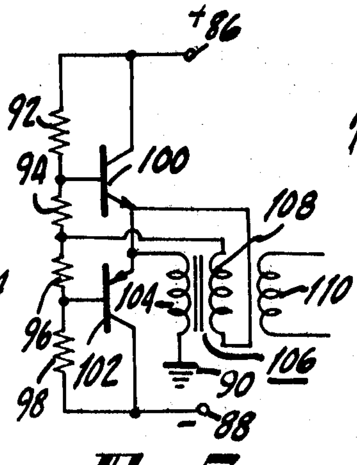

In FIG. 7, the terminals 86 and 88 of a supply source (not shown) are respectively positive and negative with respect to the grounded supply terminal 90. A potentiometer comprising resistors 92, 94, 96 and 98 is connected in the order named across the terminals 86 and 88. The collector to emitter paths of complementary transistors 100 and 102 are connected across the terminals 86 and 88, the emitter of the NPN transistor 100 being connected to the emitter of the PNP transistor 102. The primary winding 104 of a saturable transformer 106 is connected between the emitters of the transistor 100 and 102 and the intermediate or ground terminal 90 and the secondary winding 108 is connected between the emitters of the transistors 100 and 102 and a point between the resistors 94 and 96. A load winding 110 is provided to supply a load (not shown).

Since the operation of the circuit of FIG. 7 is similar to that of the circuit of FIG. 6, no detailed explanation of its operation appears necessary. The potentiometer resistors 92, 94, 96 and 98 are useful to properly proportion the static potentials applied to the transistors 100 and 102 and to provide for initial conduction of the transistors 100 and 102 to insure starting of the inverter of which they are a part.

Figure 8:
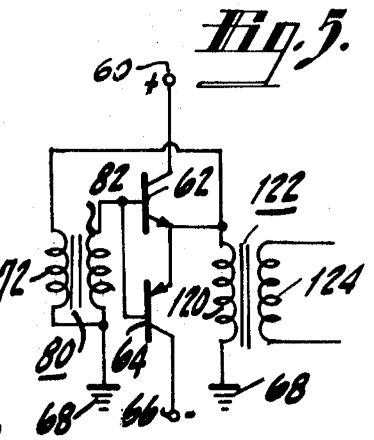

FIG. 8 illustrates an inverter such as that of FIGS. 5 and 6 except that a separate linear output transformer 122 (not found in the other figures) is provided in FIG. 8. Similar elements in FIGS. 5 and 8 that are similarly connected are given the same reference characters. In FIG. 8, one terminal of the primary winding 72 of a saturable feedback transformer 80 is connected to ground 68 and the other terminal of the winding 72 is connected to the emitters of the transistors 62 and 64. The secondary winding 82 of the transformer 80 is connected between the bases of the transistors 62 and 64 and ground 68. The primary winding 120 of the transformer 122 is connected between the emitters of the transistors 62 and 64 and ground 68. An output winding 124 across which a load (not shown) may be connected, is provided for the transformer 122. The circuit of FIG. 8 operates like the circuit of FIG. 5 except that the linear transformer 122 acts to couple the emitters of the transistors 62 and 64 to the output winding 124.

Modifications of the described inverters will occur to a person skilled in the art. For example the capacitor 50 and the inductor 46 may be interchanged in position in FIG. 3 while the capacitor 50' and the winding 46' may be interchanged in position in FIG. 4. Furthermore in both FIGS. 3 and 4, the capacitor 54 and the winding 52 may be interchanged in position. Also, instead of coupling an output winding to a saturable feedback transformer as shown in FIGS. 1–7, the output may be taken from a properly connected additional feedback transformer. Therefore, the description hereinabove is to be considered illustrative and not in a limiting sense.

We claim:

1. An inverter circuit comprising:

a pair of transistors of complementary type, each characterized by collector, emitter and base electrodes;

a pair of input terminals adapted for connection to a source of DC potential;

a first bias circuit coupling the base of one transistor and one input terminal, a second bias circuit coupling the base of the other transistor and the other input terminal;

means for connecting in a series circuit the emitter to collector paths of said transistors between said pair of input terminals; and a saturable core transformer having a primary winding and a secondary winding, said primary winding being signal driven from a point on said series circuit between the emitter to collector paths of said transistors, said secondary winding being transformer coupled to said primary winding and having one end thereof connected in circuit with said point on said series circuit, said secondary winding being further connected on the other end thereof in circuit with the base electrodes of said transistors.

2. An inverter circuit according to claim 1 wherein said base electrodes are ohmicly connected together so that variations of potential on one of said base electrodes is accompanied by corresponding variations on the other of said base electrodes.

3. An inverter circuit according to claim 1 further comprising a potentiometer connected between said input terminals, said base electrodes being connected to spaced points on said potentiometer, said circuit connection between said secondary winding and said base electrode of each of said transistors including portions of said potentiometer.

4. An inverter circuit according to claim 1 wherein said transformer further comprises an output winding adapted for connection to a load.

UNITED STATES PATENT OFFICE
CERTIFICATE OF CORRECTION

Patent No. 3,602,839 Dated August 31, 1971

Inventor(s) Wallace D. Williams, Douglas A. Moe, Carl R. Turner

It is certified that error appears in the above-identified patent and that said Letters Patent are hereby corrected as shown below:

Column 2, line 17 After "16" insert --provide a path for the energy stored in the leakage inductance of the transformer 24, and when the transistors 10 and 16--

Signed and sealed this 25th day of April 1972.

(SEAL)
Attest:

EDWARD M.FLETCHER,JR.
Attesting Officer

ROBERT GOTTSCHALK
Commissioner of Patents

RM PO-1050 (10-69)

USCOMM-DC 60376-P69